United States Patent [19]
Chang et al.

[11] Patent Number: 5,747,735
[45] Date of Patent: May 5, 1998

[54] GROUNDING CLIP FOR IC CARDS

[75] Inventors: Wei-Sun Chang, Peitou Taipei; Liu-Yuan Chen, Kaohsiung, both of Taiwan

[73] Assignee: Molex Incorporated, Lisle, Ill.

[21] Appl. No.: 812,182

[22] Filed: Mar. 6, 1997

Related U.S. Application Data

[63] Continuation of Ser. No. 354,989, Dec. 13, 1994, abandoned.
[51] Int. Cl.$^6$ ......................................................... H05K 5/02
[52] U.S. Cl. ......................... 174/51; 361/753; 361/220; 439/95
[58] Field of Search ........................... 174/51, 35 R, 174/35 MS; 361/687, 737, 753, 754, 816, 818, 212, 220; 439/95, 108, 92; 235/487, 492

[56] References Cited

U.S. PATENT DOCUMENTS 5,138,529  8/1992  Colton et al. ........................ 439/95 X
5,267,125 11/1993  Liu ......................................... 361/816

*Primary Examiner*—Kristine L. Kincaid
*Assistant Examiner*—Dean A. Reichard
*Attorney, Agent, or Firm*—Stacey E. Caldwell

[57] ABSTRACT

An IC card kit adapted for receiving a circuit board assembly, which assembly includes a generally planar circuit substrate with an electrical circuit and electrical components mounted on a surface thereof. The electrical circuit includes a ground circuit. The kit includes a frame adapted for receiving the circuit board assembly, a receptacle connector for mounting at the edge of the assembly, a pair of cover panels for sandwiching the frame and circuit board assembly, and a conductive grounding clip on the frame for engaging the ground circuit of the circuit board assembly. The clip includes a spring arm for preassembling the circuit board assembly to the frame.

5 Claims, 5 Drawing Sheets

GROUNDING CLIP FOR IC CARDS

This is a continuation of application Ser. No. 08/354,989 filed on Dec. 13 1994 now abandoned.

FIELD OF THE INVENTION

This invention generally relates to the art of IC cards and, particularly, to an IC card kit for receiving a circuit board assembly and which includes a conductive grounding clip which functions to hold the circuit board assembly in a pre-assembled condition.

BACKGROUND OF THE INVENTION

Generally, IC cards or packs, such as memory cards, are data input devices which are electrically connected to an electronic apparatus or storage device, such as a word processor, personal computer or other electronic apparatus. The data stored in the IC card is transferred to the electronic apparatus. Memory cards are portable instruments which are readily inserted and extracted from a connector which may be used with the IC card for removably coupling the IC card to a printed circuit board, for instance.

An IC card may include a frame which receives a circuit board assembly, and a panel or cover which encloses the circuit board assembly within the frame. This assembly is then held together by an adhesive material.

The circuit board assembly of an IC card conventionally includes a generally planar substrate with a plurality of electrical components mounted thereon. The electrical component(s) may include semi-conductor devices, integrated circuits, batteries or the like.

One of the problems in manufacturing IC cards as described above involves the build-up of electrical charges in the IC card. Specifically, charges are generated in the IC card during handling since the card generally is a portable instrument often carried on a human body. When a card bearing charges is inserted into an electronic apparatus or the connector thereof, the charges flow to the electronic apparatus through the connecting terminals of the connector. The charges can result in damage to or ultimate failure of the integrated circuits or other circuit elements on the card as well as the electronic apparatus itself.

Consequently, structures have been embodied in IC cards and/or their mating connectors for removing static electrical charges stored in the cards. The card typically is grounded to the electronic apparatus. To facilitate grounding and to provide effective static protection, IC cards have been provided with conductive grounding clips for engaging appropriate ground means on the mating electronic apparatus. In fact, with the recent standardization of memory card-receiving connectors (such as PCMCIA and JEIDA), the location of the grounding clips on the IC card (and the mating connector) is provided at a fixed location along the outer side edge thereof.

Previous designs of grounding clips include stand-alone grounding elements soldered directly to the internal circuit board and coupled directly to one or both covers, and clips fixed on one end to the card frame or formed integrally with a shield or cover for connection to a grounding pad on a bottom surface of the internal circuit board. Each of these designs have drawbacks however. The stand-alone grounding elements tend to be very small components which require fixturing and/or special handling during assembly. The clips fixed to the card frame typically are soldered to a grounding pad on the bottom surface of the internal circuit board. Accordingly, as the board is processed upside-down during soldering, the board must be fixtured to prevent misalignment or disassociation of the board relative to the clip and frame assembly. In some cases, struts on the frame itself can interfere with the soldering. In the case of grounding clips integral with a shield or cover, the stamping and forming of such an element becomes complicated and expensive, particularly since the robust material of the cover also is used to form the resilient grounding clip, thus making the clip particularly susceptible to inelastic deformation. Furthermore, because of the number of components involved in a memory card assembly (i.e. circuit board, frame, receptacle connector, top and bottom covers, etc.), additional components can make the assembly of the memory card increasingly difficult without the use of interengagement or preassembly of certain of the components.

The present invention is directed to solving some of the above problems by providing a conductive grounding clip for an IC card which performs the dual function of holding the IC card, particularly the circuit board thereof, in a pre-assembled condition and also of serving as a grounding means for the assembled IC card.

SUMMARY OF THE INVENTION

An object, therefore, of the invention is to provide a new and improved conductive grounding clip for an IC card of the character described above.

In the exemplary embodiment, the invention is incorporated in an IC card kit for receiving a circuit board assembly having a generally planar substrate with a plurality of electrical components mounted thereon. The kit includes a receptacle, including terminals, adapted to be mounted at an edge of the circuit board assembly; a pair of covers for sandwiching the circuit board assembly therebetween while allowing a mating face of the receptacle to be exposed for connection to an appropriate mating electrical apparatus; and a frame for receiving the circuit board assembly includes support means thereon for supporting the circuit board assembly.

The invention contemplates the provision of an electrical circuit on an upper surface of the substrate which includes a grounding circuit for coupling to the ground of the mating electrical apparatus. A conductive grounding clip is provided on the frame adapted to be engageable with the ground circuit and which includes hold-down means for holding the circuit board assembly on the support means of the frame.

As disclosed herein, the conductive ground clip is stamped and formed of conductive sheet metal material and includes a spring arm for snappingly engaging the circuit board assembly in response to positioning it on the support means. The spring arm forms an integral portion of the grounding clip which is engageable with the ground circuit. Therefore, the grounding clip performs the dual function of holding the circuit board assembly in a pre-assembled condition and as a grounding means for the IC card. The grounding clips may be provided -at each opposite edge of the circuit board assembly.

Other objects, features and advantages of the invention will be apparent from the following detailed description taken in connection with the accompanying drawings.

BRIEF DESCRIPTION OF THE DRAWINGS

The features of this invention which are believed to be novel are set forth with particularity in the appended claims. The invention, together with its objects and the advantages

Figure 1:
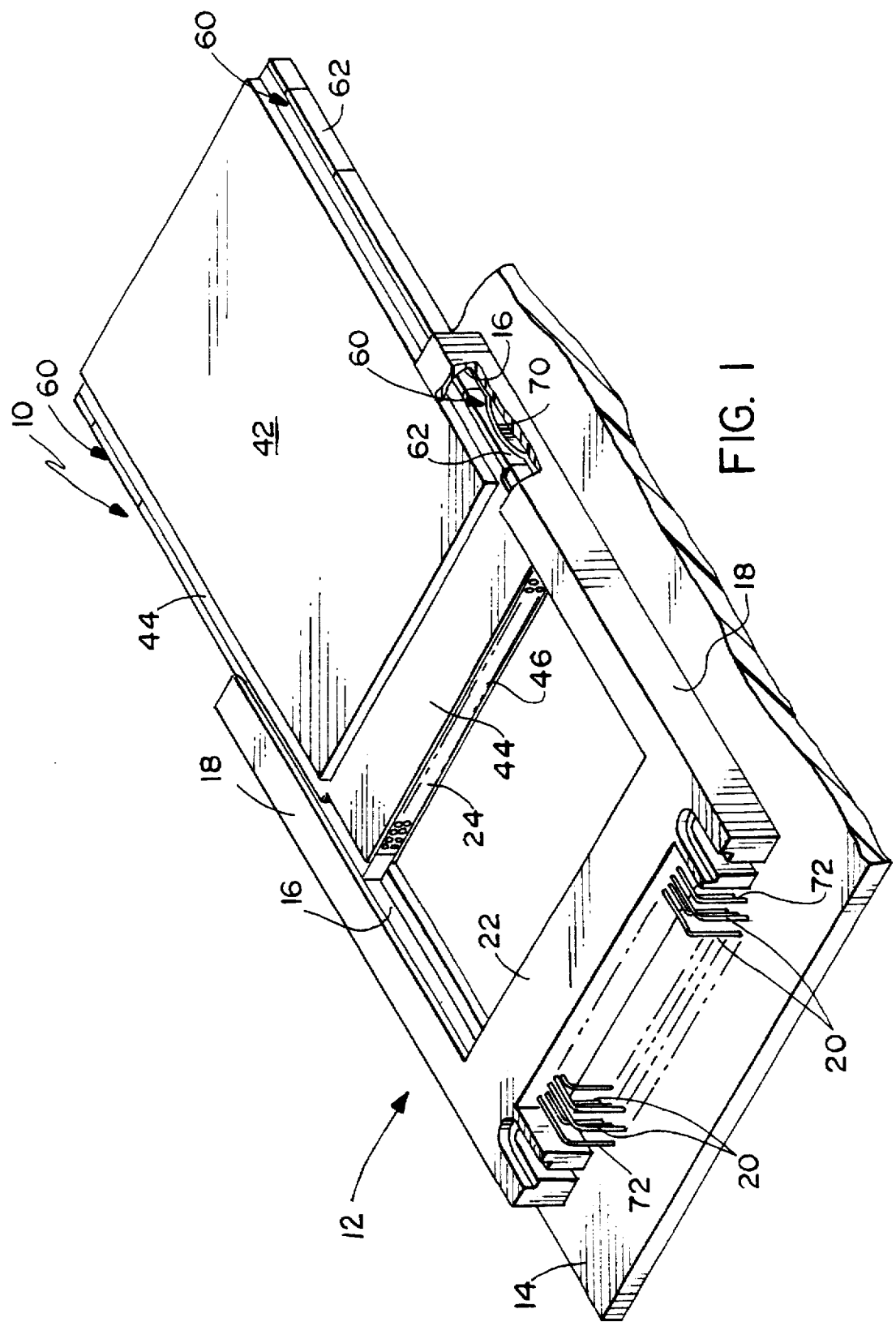
Figure 2:
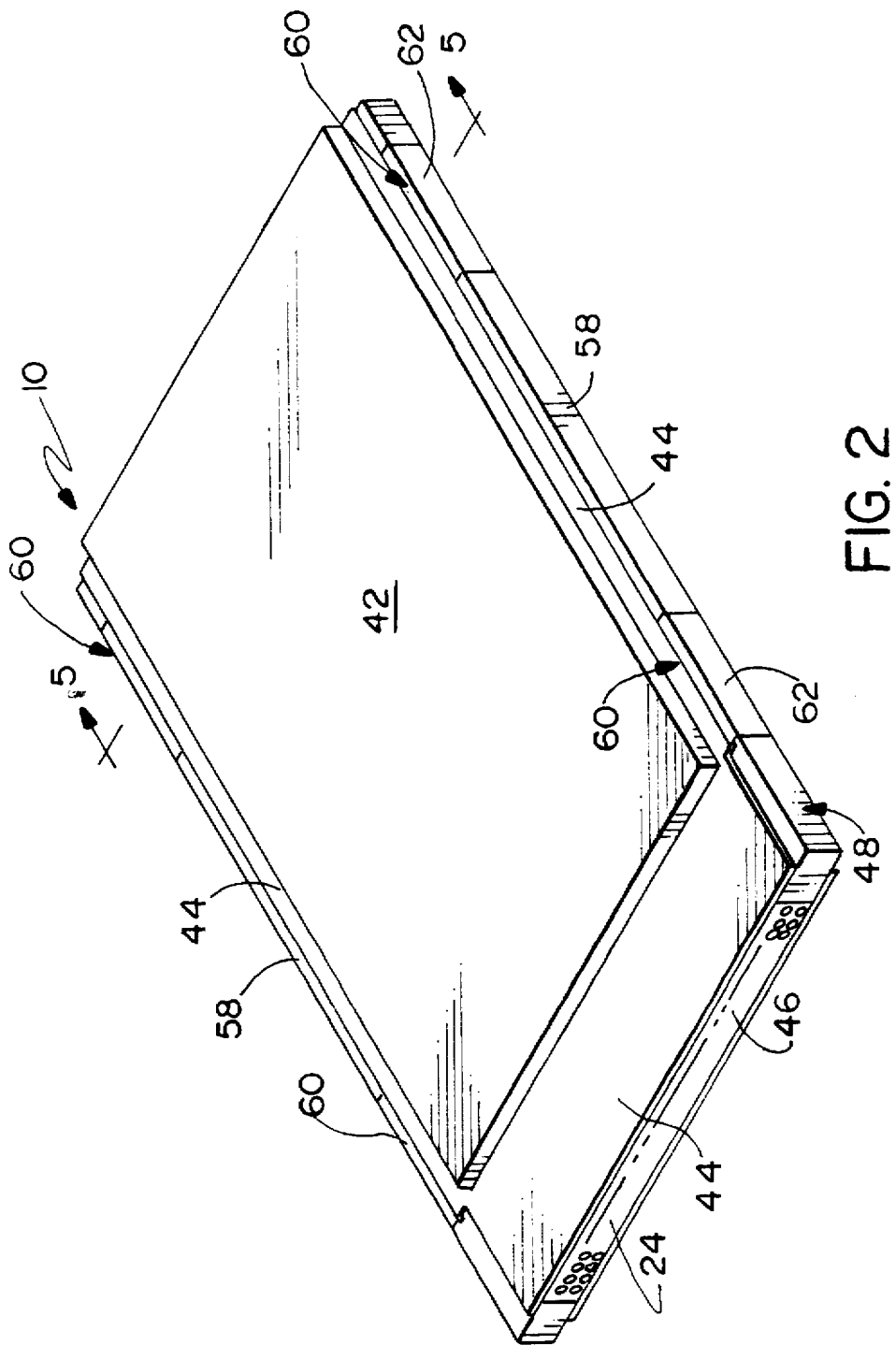
Figure 3:
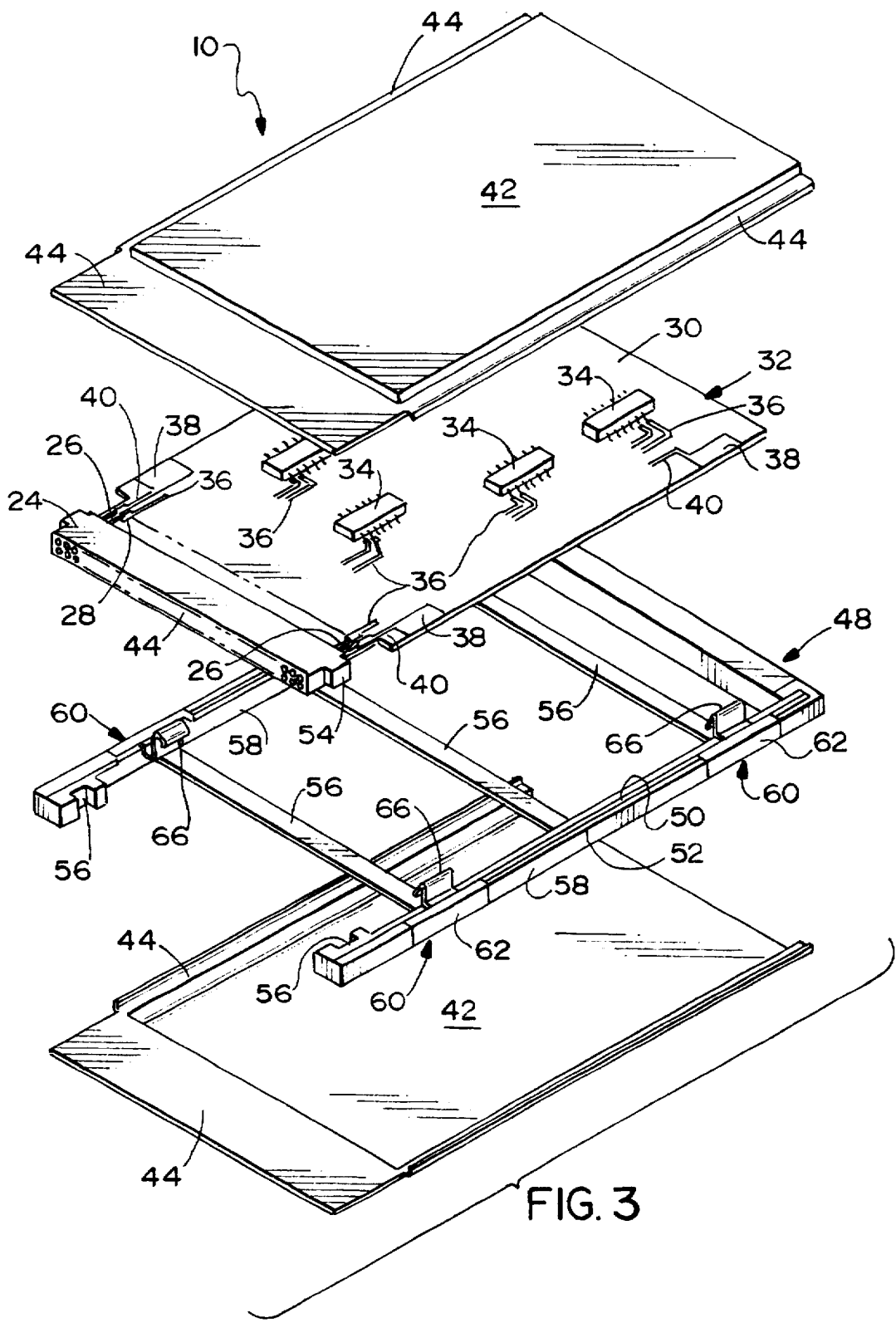
Figure 4:
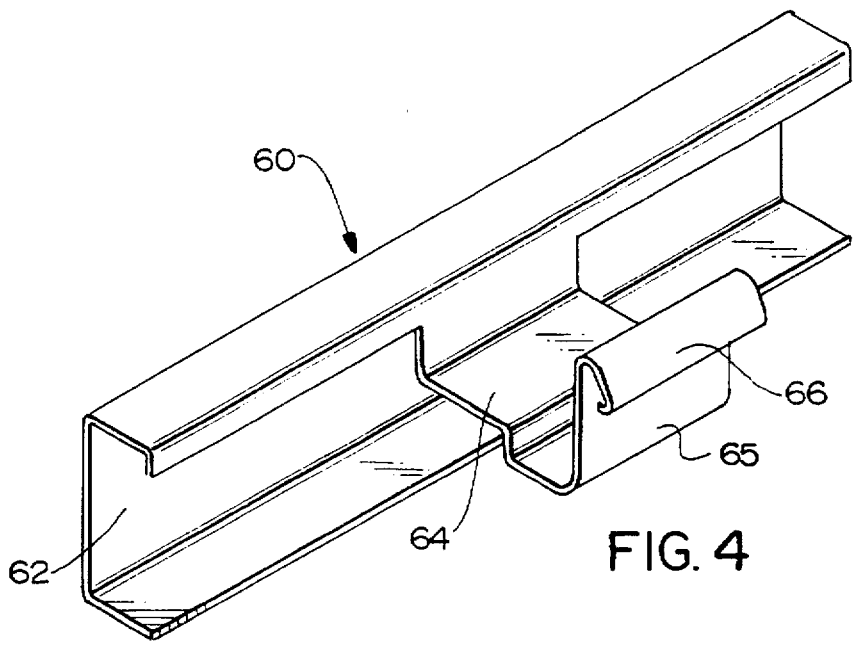
Figure 5:
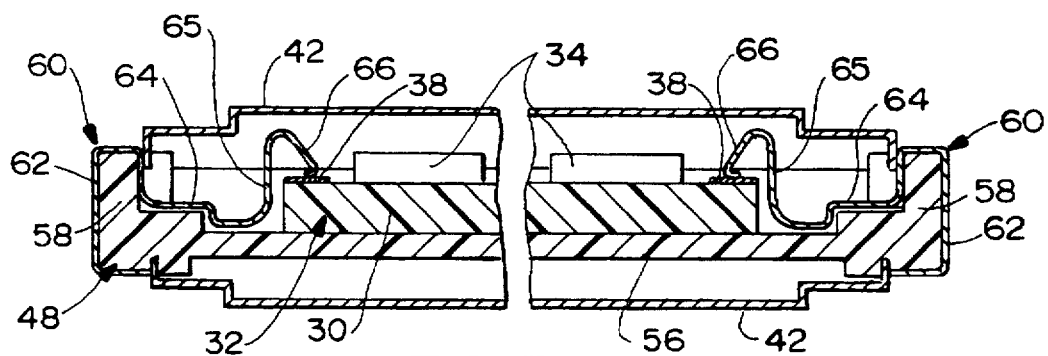
Figure 6A:
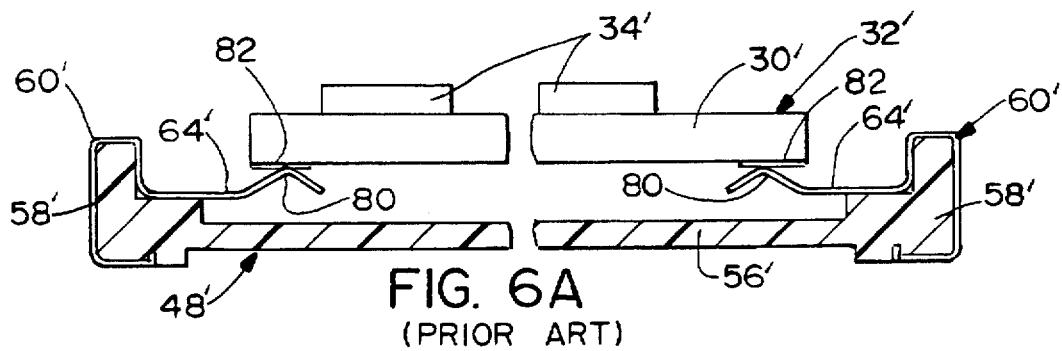
Figure 6B:
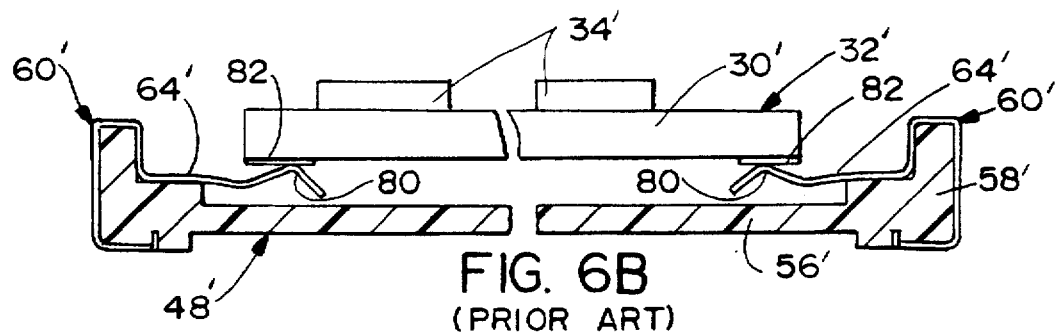
Figure 7A:
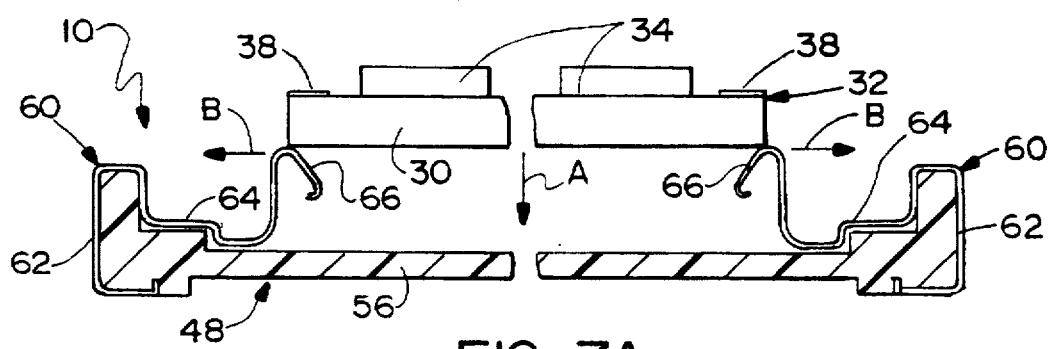
Figure 7B:
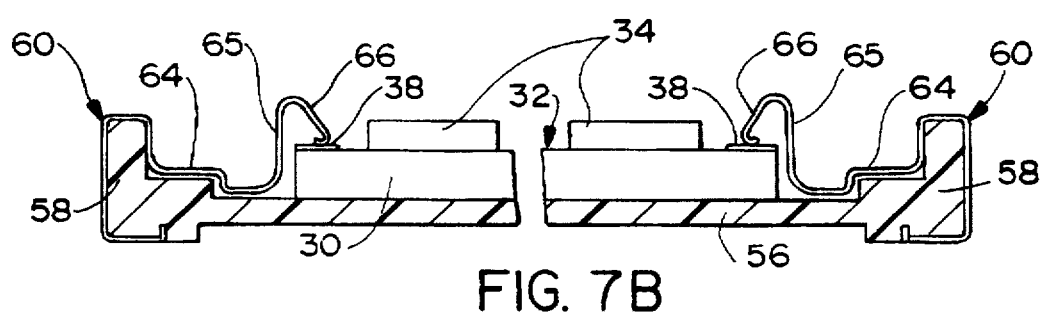

3 thereof, may be best understood by reference to the following description taken in conjunction with the accompanying drawings, in which like reference numerals identify like elements in the figures and in which:

FIG. 1 is a perspective view of an assembled IC card according to the invention, being inserted into a header connector surface mounted on a printed circuit board;

FIG. 2 is a perspective view of the IC card;

FIG. 3 an exploded perspective view of the components of the IC card kit, including a circuit board assembly for being received therein;

FIGS. 4 is an enlarged perspective view of one of the conductive grounding clips of the IC card kit;

FIG. 5 is a vertical section, on an enlarged scale, taken generally along line 5—5 of FIG. 2;

FIGS. 6A and 6B are fragmented vertical sections through a prior art IC card circuit board assembly and frame, showing the manner of assembling the board to the frame; and FIGS. 7A and 7B are views similar to that of FIGS. 6A and 6B, but showing the manner of assembling the circuit board assembly to the frame in the IC card kit of the present invention.

DETAILED DESCRIPTION OF THE PREFERRED EMBODIMENT

Referring to the drawings in greater detail, and first to FIG. 1, the invention is embodied in a kit for fabricating an IC card, generally designated 10, which is provided as a data input device, such as a memory card, for connection to an electronic apparatus or storage device, such as a word processor, personal computer or other electronic apparatus through a header connector, generally designated 12, which is surface mounted to a printed circuit board 14. The IC card is inserted into a pair of channels 16 formed on the insides of a pair of elongated arms 18 projecting rearwardly of header connector 12. The header connector includes a plurality of right-angled input terminals 20 which extend through appropriate holes in printed circuit board 14 and into a transverse connector portion 22 of the header connector. The data stored in memory card 10 is transferred to the header connector through terminals within an elongated receptacle 24 mounted at the front edge of the card.

Referring to FIGS. 2 and 3 in conjunction with FIG. 1, the IC card kit includes an elongate receptacle 24 which mounts a plurality of input terminals 26 (FIG. 3). The terminals are adapted to mechanically and electrically engage contact pads 28 on a circuit substrate 30 of a circuit board assembly, generally designated 32. Various electrical components 34 are surface mounted to substrate 30, along with an electrical circuit which includes circuit traces 36 leading to contact pads 28 at the front edge of substrate 30. This edge is adapted to be coupled to elongated receptacle 24, and the receptacle is in turn interconnectable with connector portion 22 of header connector 12 (FIG. 1) and terminals 20 therein, such that data stored in circuit board assembly 32 is transferred to printed circuit board 14 through the header connector. For purposes to be described in greater detail hereinafter, the electrical circuit of substrate 30 of circuit board 32 includes ground circuit means provided thereon having four ground pads 38 and ground traces 40 to be electrically coupled to ground terminals of receptacle 24.

The above description of circuit board assembly 32 is generally conventional, except for the particular ground means, and, consequently, the depiction of the circuit board assembly is not in the utmost detail. However, it should be understood that electrical components or circuit elements 34 may comprise semi-conductor devices, batteries, and other parts of integrated circuits from which stored data is transferred to the electronic apparatus through as header connector 12 and printed circuit board 14.

Still referring to FIGS. 1–3, the IC card kit includes a pair of covers 42 adapted to sandwich circuit board assembly 32 therebetween. The covers have peripheral flanges 44 which space the panels from circuit board assembly 32 and accommodate electrical components or circuit elements 34. Upon assembly, the front flanges 44 sandwich elongated receptacle 24, leaving at least a mating face 46 of the receptacle exposed at the front of the IC card for connection to terminals 20 (FIG. 1) in connector portion 22 of header connector 12.

As best seen in FIG. 3, but still referring to FIGS. 1 and 2, circuit board assembly 32, including substrate 30 and receptacle 24, is adapted to be mounted within a frame, generally designated 48, of the IC card kit. The frame includes an opening or recess 50 in a top surface 52 thereof for receiving circuit board assembly 32. Receptacle 24 includes a pair of ears 54 at opposite ends thereof for positioning into notches 56 on the inside of the frame at the forward end thereof. The frame includes support means in the form of a plurality of cross braces 56 facing opening 50 for supporting circuit board assembly 32 within the frame in the orientation depicted in FIG. 3. When so supported, covers 42 can be positioned about the top and bottom surfaces of the frame, as by adhesives or other means, to sandwich the circuit board assembly therebetween. The frame is unitarily molded of dielectric material, such as plastic or the like, whereby braces 56 span opposite sides 58 of the frame. This relative assembled condition of the IC card is shown in the sectional view of FIG. 5.

Referring to FIG. 4 in conjunction with FIG. 3, the invention contemplates the provision of at least one conductive grounding clip, generally designated 60, for both facilitating the assembly of IC card 10 and grounding the card to a corresponding ground means exteriorly of the card, such as on the mating apparatus or the connector thereof, e.g. header connector 12 (FIG. 1).

More particularly, as best seen in FIG. 4, each grounding clip 60 has an inwardly opening channel-shaped body portion 62 and an inwardly projecting spring arm 64 which has a vertical leg portion 65 that terminates in a down-turned hook portion 66. Four grounding clips 60 are provided on frame 48 of IC card 10, two of the grounding clips being spaced along each side 58 of the frame as seen clearly in FIG. 3. Channel-shaped body portions 62 of the clips are shaped and configured for embracing sides 58 of frame 48 as is shown in FIG. 5. Hook portions 66 of the grounding clips are adapted for engaging ground pads 38 on the top of substrate 30 of circuit board assembly 32, as is also shown in FIG. 5. Each grounding clip 60 is stamped and formed from conductive sheet metal material. Therefore, spring arm 64 and hook portion 66 are resilient in nature, for purposes described hereinafter. Therefore, hook portions 66 of grounding clips 60 perform the dual functions of engaging ground pads 38 of circuit board 32 and holding the circuit board assembly to frame 48.

At this point, it should be understood that the use of such terms as "top" or "upper" herein and in the claims is not intended to be limiting in any nature. IC card 10, along with header connector 12 and printed circuit board 14 are omnidirectional in use, and, consequently, the "top" surface of circuit board assembly 32 may actually be the bottom surface in a particular use. Such directional terms are used herein only to best describe the invention and not to limit the invention in any way.

Grounding clips 60 are adapted to be located and spaced along the side edges of IC card 10 in order to contact corresponding ground means on header connector 12 during insertion of the IC card into the header connector. FIG. 1 shows such a ground contact 70 on the inside of channel 16 in header 12 corresponding to the positions of the grounding clips 60 shown in FIG. 3. Although only one is shown, a pair of ground contacts 70 are located in header connector 12, one within each channel 16, to discharge built-up static electrical charges within IC card 10 prior to complete connection of the IC card to the header connector. Ground contacts 70 are coupled to ground terminals 72 (FIG. 1) at the opposite ends of the array of terminals 20. The engagement between grounding clips 60 and ground contacts 70 is made prior to input terminals 20 engaging terminals 26 of circuit board assembly 32 of IC card 10 so that static charges are discharged prior to mating of the terminals. To this end, ground terminals 72 within connector portion 22 of header connector 12 may be made longer than input terminals 20 so that the IC card is grounded to mating header connector 12 and printed circuit board 14 prior to engagement of the respective input terminals.

FIGS. 6A and 6B, in comparison to FIGS. 7A and 7B, show the advantages of the present invention over a known prior art IC card kit. In particular, referring first to FIGS. 6A and 6B, the prior art IC card kit includes a frame, generally designated 48', which includes side portions 58' joined by cross braces 56'. A pair of grounding clips 60' embrace side portions 58' and include inwardly directed spring arms 64'. The spring arms terminate in contact portions 80 that are adapted to engage ground pads 82 on the bottom side of a substrate 30' of a circuit board assembly 32'. The circuit board assembly mounts a plurality of electrical components 34' on the upper surface of the substrate. During assembly of the IC card, contact portions 80 must be soldered to ground pads 82 on the bottom or lower surface of circuit board assembly 32'. Since the circuit board assembly freely rests on top of the contact portion of the grounding clip, fixturing and/or special handling is required during such assembly. With the ground pads and contact portions being on the bottom of the circuit board assembly, the assembly must be inverted during soldering/assembly and must be fixtured to prevent misalignment or disassociation of the assembly relative to the grounding clips and frame 48'. Keeping in mind that these components are very small, the fabrication and assembly of such IC cards is therefore time consuming and expensive.

Referring now, to FIGS. 7A and 7B, according to the invention, it can be seen that circuit board assembly 32 of IC card 10 according to the invention, has ground pads 38 on the top side thereof. During assembly, circuit board assembly 32 is pressed downwardly in the direction of arrow "A"(FIG. 7A). The side edges of substrate 30 of circuit board assembly 32 engage hook portions 66 of grounding clips 60 and, with the hook portions and spring arms 64 being fabricated of sheet metal material, the hook portions are biased outwardly in the direction of arrows "B" so that the circuit board assembly is pushed past the hook portions.

Once circuit board assembly 32 is assembled to frame 48 such that substrate 30 is supported on a portion of the frame such as on braces 56, as seen in FIG. 7B, hook portions 66 of grounding clips 60 spring back inwardly whereby the hook portions engage ground pads 38 on the top surface of the substrate and hold the circuit board assembly to frame 48. In order to enhance this assembly action, it can be seen in FIGS. 7A and 7B that hook portions 66 are angled inwardly to provide a camming action between the hook portions and substrate 30 of circuit board assembly 32. In addition, the resilient nature of spring arms 64 of the grounding clips allow for the snapping back or latching of the hook portions 66 over the top of the circuit board assembly.

From the foregoing description of FIGS. 7A and 7B, it can be understood that conductive grounding clips 66 perform dual functions within the structure of the IC card kit, namely: (1) facilitating grounding of the IC card to remove static electrical charges therefrom, and (2) facilitating assembly and fabrication of the IC card by removably securing the circuit board assembly to the frame in an appropriate supported position during soldering and assembly.

It will be understood that the invention may be embodied in other specific forms without departing from the spirit or central characteristics thereof. The present examples and embodiments, therefore, are to be considered in all respects as illustrative and not restrictive, and the invention is not to be limited to the details given herein.

We claim:

1. An IC card kit adapted for receiving a circuit board assembly, said circuit board assembly including a generally planar substrate having two generally parallel surfaces with an electrical circuit and a plurality of electrical components mounted on one of the surfaces, the electrical circuit including a grounding circuit, the card kit comprising:

a substantially rectangular frame having support means thereon adapted for supporting the circuit board assembly;

a receptacle connector adapted to be mounted at an edge of the circuit board assembly and electrically coupled to the electrical circuit;

a pair of cover panels adapted for sandwiching the circuit board assembly therebetween; and a conductive grounding clip independent of the cover panels adapted for mounting on the frame and having
a spring arm with a down-turned hook portion adapted for resiliently engaging a portion of the grounding circuit on said one of the surfaces of the substrate, and
a body portion adapted to be secured to and extend in a single direction along an outside surface of the frame,
wherein the spring arm is configured to engage a portion of the grounding circuit on said one of the surfaces while resiliently and removably latching the circuit board assembly to the frame
whereby the spring arm holds the circuit board assembly to the frame and secures the circuit board assembly in a supported position on the frame prior to assembly of the cover panels.

2. An IC card kit as set forth in claim 1, wherein said spring arm of said grounding clip comprises a vertical leg portion extending generally parallel to the body portion and the down-turned hook portion of the spring arm is angled inwardly to provide a camming action between the hook portion and the substrate so that the hook portion resiliently engages said one of the surfaces of the substrate and holds the substrate to the frame in response to positioning the circuit board assembly on said support means of said frame.

3. In an IC card kit for receiving a circuit board assembly having a generally planar substrate with a ground circuit and plurality of electrical components mounted on a top surface thereof, the kit including a frame having a recess in a surface thereof for receiving the circuit board assembly, and support means on the frame for supporting the circuit board assembly, cover means for sandwiching the circuit board assembly between two panels thereof, wherein the improvement comprises:

a conductive grounding clip independent of the cover means for mounting on the frame and adapted to engage the ground circuit of the circuit board assembly and including a spring arm having a vertical leg portion and a down-turned hook portion that resiliently engages the top surface of the substrate and secures the circuit board assembly in a supported position on the frame prior to assembly of the cover means.

4. A conductive grounding clip for providing a ground connection between an IC card and an electrical apparatus, the IC card including a circuit board assembly having a generally planar substrate with a grounding circuit on a surface thereof, a frame for supporting and receiving the circuit board assembly, and a pair of cover panels sandwiching the circuit board assembly therebetween, the grounding clip adapted to be mounted on the frame independently of the cover panels and comprising:

a spring arm adapted for engaging a portion of the grounding circuit on the surface of the substrate, and a substantially planar body portion adapted to be secured to a portion of the frame, wherein the spring arm includes a vertical leg portion terminating in a hook portion configured to resiliently and removably latch the circuit board assembly to the frame and secure the circuit board assembly in a supported position on the frame during assembly.

5. A conductive grounding clip as set forth in claim 4 wherein the hook portion is adapted to engage the grounding circuit on the surface of the substrate.

\* \* \* \* \*